(12) United States Patent
Riley et al.

(10) Patent No.: US 9,575,891 B2
(45) Date of Patent: Feb. 21, 2017

(54) SIDECAR SRAM FOR HIGH GRANULARITY IN FLOOR PLAN ASPECT RATIO

(71) Applicant: Advanced Micro Devices, Inc., Sunnyvale, CA (US)

(72) Inventors: John R. Riley, Spicewood, TX (US); Russell Schreiber, Austin, TX (US); Donald R. Weiss, Fort Collins, CO (US); John J. Wuu, Fort Collins, CO (US); William A. McGee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 191 days.

(21) Appl. No.: 14/307,164

(22) Filed: Jun. 17, 2014

(65) Prior Publication Data
US 2015/0364168 A1    Dec. 17, 2015

(51) Int. Cl.
*G06F 12/00* (2006.01)
*G06F 12/06* (2006.01)
*G11C 5/02* (2006.01)

(52) U.S. Cl.
CPC ....... *G06F 12/0607* (2013.01); *G06F 12/0623* (2013.01); *G11C 5/025* (2013.01); *G06F 2212/1052* (2013.01); *G06F 2212/2532* (2013.01)

(58) Field of Classification Search
None
See application file for complete search history.

(56) References Cited

U.S. PATENT DOCUMENTS

| | | | |
|---|---|---|---|
| 6,549,987 B1 * | 4/2003 | Rappoport | G06F 12/0846 365/49.16 |
| 8,645,893 B1 | 2/2014 | Yeung et al. | |
| 9,275,721 B2 | 3/2016 | Chen et al. | |

* cited by examiner

*Primary Examiner* — Brian Peugh
(74) *Attorney, Agent, or Firm* — Rory D. Rankin; Meyertons, Hood, Kivlin, Kowert & Goetzel, P.C.

(57) ABSTRACT

A system and method for floorplanning a memory. A computing system includes a processing unit which generates memory access requests and a memory. The size of each memory line in the memory includes M bits. The memory includes at least a primary bank and a sidecar bank. The primary bank includes a first portion with (M−A) bits of the M bits of a memory line being accessed. The sidecar bank includes a second portion with A bits of the M bits of the memory line being accessed. The primary bank and the sidecar bank have a same height, which is less than a height that would be used if the primary bank included all M bits in each memory line. The completion of the access request for the M bits of the memory line is done at a similar time, such as a same clock cycle.

17 Claims, 9 Drawing Sheets

SIDECAR SRAM FOR HIGH GRANULARITY IN FLOOR PLAN ASPECT RATIO

BACKGROUND

Field of the Invention

This invention relates to computing systems, and more particularly, to efficiently floor planning a memory.

Background

Generally speaking, a semiconductor chip includes at least one processing unit coupled to a memory. The processing unit processes instructions of a predetermined algorithm. The processing may include fetching instructions and data, decoding instructions, executing instructions and storing results. While executing instructions, the processing unit may perform calculations and generate memory access requests. The memory may be accessed for the fetching operations and the generated memory access requests, which include storing results.

In some embodiments, the processing unit and the memory are on a same die. In other embodiments, the processing unit and the memory are on different dies within a same package such as a system-on-a-chip (SOC). The die or the package may include other units or components, such as an interface unit, in addition to the processing unit and the memory. The dimensions of the individual components have limits in order to place all of the components on a same die or a same package. For several types of memory, the dimensions may exceed limits for efficient placement.

In some embodiments, the dimensions of the memory, such as the height or the width, may be large enough that they interfere with the placement of other components. In some cases the other components may not even fit within the same die or the same package. Consequently, the chip may be rendered inoperable without significant redesign. In other cases the components may fit within the same die or package, but their placement may be such that unused space on the die or package results. In this case, the placement of the components may be deemed inefficient, as otherwise usable space is rendered unusable due to the placement. In addition to the above, altering the dimensions of the memory may be difficult as the row or entry decoding is typically dependent on a $2^x$ value. This value may sets one dimension, such as the width, while the dimensions of an individual memory cell may set the height. In addition, dimensions may be determined by the bit separation or interleaving used to defend against soft errors.

In view of the above, efficient methods and systems for efficiently floor planning a memory are desired.

SUMMARY OF EMBODIMENTS

Systems and methods for efficiently floor planning a memory are contemplated. In various embodiments, a computing system includes a processing unit, a memory and control logic. The processing unit generates memory access requests for the memory. The size of each memory line in the memory includes M bits, wherein M is an integer. The memory includes at least a primary bank and a sidecar bank. The primary bank includes a first portion of each memory line. The first portion includes (M−A) bits of the M bits of a memory line, wherein A is an integer. The sidecar bank includes a second portion of each memory line. The sidecar bank includes A bits of the M bits of a memory line. For example, the memory line may include 74 bits with 60 bits of the memory line in the primary bank and 14 bits of the memory line in the sidecar bank. In some examples, the sidecar bank includes the most-significant bits 73 to 60. The primary bank includes the least-significant bits 59 to 0. However, other combinations of the storage of the bits in the memory line are possible and contemplated. Additionally, in various embodiments, the primary bank stores the primary portion of each memory line in a vertical orientation. Similarly, the sidecar bank stores the secondary portion of each memory line in a vertical orientation. However, in other embodiments, a horizontal orientation may also be used for storage of the memory lines.

The control logic receives memory access requests from the processing unit. A received access request corresponds to a predetermined memory line in the memory. For the received access request, the control logic accesses a first entry of multiple entries in the primary bank and a second entry of multiple entries in the sidecar bank using a same address in the received access request. The control logic completes the access request in a predetermined portion of the first entry of the primary bank. In various embodiments, the predetermined portion of the first entry includes (M−A) bits corresponding to the address in the received access request. As an example, the control logic completes the access request in a 60-bit portion of the first entry. The first entry may include more bits than the (M−A) bits corresponding to the address in the received access request. As an example, the first entry may include 480 bits, which is greater than the 60-bit portion corresponding to the address in the received access request.

Similarly, the control logic completes the access request in a predetermined portion of the second entry of the sidecar bank. In various embodiments, the predetermined portion of the second entry includes A bits corresponding to the address in the received access request. As an example, the control logic completes the access request in a 14-bit portion of the second entry. The second entry may include more bits than the A bits corresponding to the address in the received access request. As an example, the second entry may include 480 bits, which is greater than the 14-bit portion corresponding to the address in the received access request. In various embodiments, the control logic completes the access request in each of the primary bank and the sidecar bank in a same clock cycle.

In various embodiments, each of the primary bank and the sidecar bank stores respective portions of memory lines in a vertical orientation and each of the primary bank and the sidecar bank has a same height. The shared height is less than a height that would be used if the primary bank included all M bits in each memory line and no sidecar bank was used. In some embodiments, the sidecar bank has a number of entries equal to the number of entries in the primary bank divided by the integer D. The integer D is the largest $2^x$ value and still less than or equal to the ratio of (M−A)/A. For example, if the memory line includes 74 bits in a memory line, the first portion in the primary bank includes 60 bits of a memory line, and the second portion in the sidecar bank includes 14 bits of a memory line, then the ratio of (M−A)/A is (74−14)/14, which is 60/14 or 4.29. The largest $2^x$ value and is still less than or equal to 4.29 is 4. Therefore, in this example, the integer D is 4. In this example, if the primary bank has 128 entries or rows, then the sidecar bank has 128/4 entries or 32 entries.

In addition, in some embodiments, the primary bank includes a bit separation or a bit interleaving S1 for protection of soft errors. For example, the primary bank may have a bit separation of S1=8. Therefore, the first portion is not stored as contiguous bits in the first entry of the primary bank. Rather, continuing with the above example, each bit of a 60-bit first portion is separated by 7 bits to protect against soft errors. The height of the primary bank in this example is the height of a memory bit cell times the 60 bits times the bit separation S1, which is 8. Therefore, in this example, when a memory bit cell has a height of 2 microns, the height of the primary bank is 2 microns/bit times 60 bits times 8, which is 960 microns. This height is less than a height that would be used if the primary bank included all M bits in each memory line and no sidecar bank was used. This height in this example would be 2 microns/bit times 74 bits times 8, which is 1,184 microns.

The sidecar bank has a bit separation S2 equal to D times S1. Continuing with the above example, the integer D is 4 and the bit separation S1 in the primary bank is 8, then the bit separation S2 for the sidecar bank is 4 times 8, which is 32. The calculated height for the sidecar bank is 2 microns/bit times 14 bits times 32, which is 896 microns. The sidecar bank may be placed with a same height as the primary bank with a height of 960 microns. The sidecar bank, in this example, has (960–896) microns, or 64 microns, unused. However, the overall height of the memory is reduced from 1,184 microns to 960 microns. In addition, the completion of the access request for all M, or 74, bits of the memory line is done at a similar time, such as a same clock cycle. The completion of the access request is not staggered for the primary bank and the sidecar bank.

These and other embodiments will be further appreciated upon reference to the following description and drawings.

Figure 1:
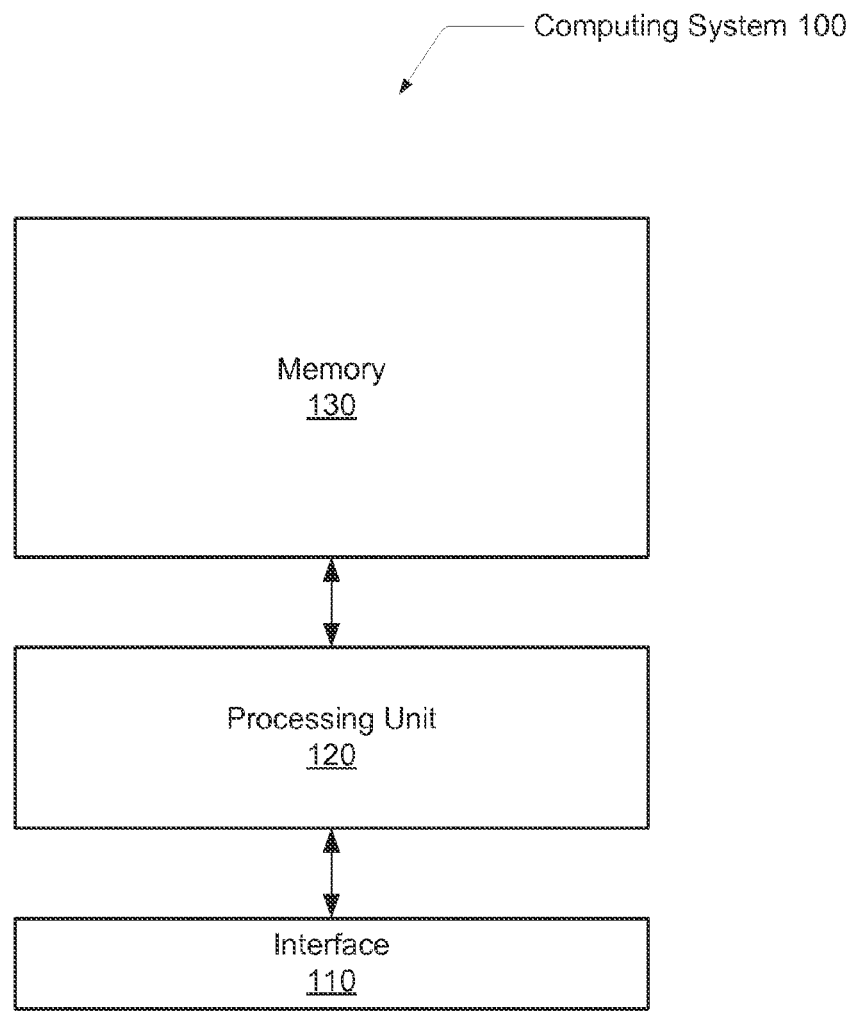
FIG. 1 is a generalized block diagram of one embodiment of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION OF EMBODIMENT(S)

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

It will be appreciated that for simplicity and clarity of illustration, elements shown in the figures have not necessarily been drawn to scale. For example, the dimensions of some of the elements are exaggerated relative to other elements.

TERMINOLOGY

The following paragraphs provide definitions and/or context for terms found in this disclosure (including the appended claims):

In the detailed description that follows, references to "one embodiment," "an embodiment," "an example embodiment," etc., indicate that the embodiment described includes a particular feature, structure, or characteristic. However, it is to be understood that not every embodiment necessarily includes the particular feature, structure, mode of operation, or characteristic. Moreover, such phrases are not necessarily referring to the same embodiment. Alternate embodiments is devised without departing from the scope of the disclosure, and well-known elements of the disclosure may not be described in detail or is omitted so as not to obscure the relevant details. Further, when a particular feature, structure, or characteristic is described in connection with an embodiment, it is submitted that it is within the knowledge of one skilled in the art to affect such feature, structure, or characteristic in connection with other embodiments whether or not explicitly described. In addition, the description refers to particular embodiments as having particular characteristics or performing particular actions using terms such as "does", "is", "uses", "utilizes", or otherwise. However, it is to be understood that various embodiments do not have the described characteristics or perform the described actions. Rather, alternate embodiments are devised without departing from the scope of the disclosure as noted above.

In addition to the above, the terminology used herein is for the purpose of describing particular embodiments only and is not intended to be limiting of the disclosure. For example, as used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to. As used in the appended claims, these terms do not foreclose additional structure or steps. Consider a claim that recites: "A computing system comprising one or more processor cores . . . ." Such a claim does not foreclose the computing system from including additional components (e.g., a GPU, one or more memory devices).

"Configured To." Various units, circuits, or other components is described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" also includes adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that affect a determination. That is, a determination is solely based on those factors or based, at least in part, on those factors. Consider the phrase "determine A based on B." While B is a factor that affects the determination of A, such a phrase does not foreclose the determination of A from also being based on C. In other instances, A is determined based solely on B.

Referring to FIG. 1, one embodiment of a computing system 100 is shown. Generally speaking, the computing system 100 may include a processing unit 120, a memory 130, and an interface 110. In some embodiments, the functionality of the computing system 100 is included as components on a single die, such as a single integrated circuit. In other embodiments, the functionality of the computing system 100 is included as multiple dies on a system-on-a-chip (SOC). The computing system may be used in a desktop, a portable computer, a mobile device, a server, a peripheral device, or other. The interface 110 may include interface control logic for communicating with devices and units located externally to the computing system 100. The control logic in the interface 110 may operate according to communication protocols corresponding to external units. The interface 110 may include buffers for storing both internally and externally generated requests and results.

The processing unit 120 processes instructions of a predetermined algorithm. The processing may include fetching instructions and data, decoding instructions, executing instructions and storing results. The processing unit 120 may be a general-purpose microprocessor, an application specific integrated circuit (ASIC), a single-instruction-multiple-data (SIMD) microarchitecture processor, and so forth. While executing instructions, the processing unit 120 may perform calculations and generate memory access requests.

The memory 130 may be accessed for the fetching operations and the generated memory access requests, which include storing results. In some embodiments, the memory 130 is a cache hierarchy memory subsystem. In other embodiments, the memory 130 is a random access memory (RAM). In yet other embodiments, the memory 130 is a set of one or more buffers. In still yet other embodiments, the memory 130 is a field programmable gate array (FPGA). Although a single memory is shown, in various embodiments, multiple memories may be used in the computing system 100. The memory 130 may be a complete memory or a portion of a memory subsystem. In various embodiments, the memory 130 has a layout dimension size, such as a height or a width, which may be sufficiently great as to interfere with the placement of the components in the computing system 100.

Continuing with the memory 130, the other components in the computing system 100 may not fit within the same die or the same package due to the height or the width of the memory 130. Alternatively, the other components may fit within the same die or the same package but the placement of the components creates unused space. The pitch used for the computing system 100 may refer to a minimum allowable distance between two entities. Different pitches may be used for different entities. The entities may be transistor gates or two metal lines on a particular metal layer in a fabrication process. The pitch-matching between two components in the computing system 100 allows connection of the two components by abutment and no extra on-die real estate is used for wire routes (metal lines) between the two components. In addition, the power supply and ground reference lines may have fixed locations for the pitch-matched components. Further, each of the pitch-matched components may have a fixed height or a fixed width. For the components to be pitch-matched to the die or package, the components may be located on the die at a distance that is an integer multiple of a pitch match measured from a given corner of the die, such as the bottom left corner of the die.

The components in the computing system 100 may not pitch-match to die or package. The placement of the components is either inefficient or renders the chip inoperable. Altering the dimensions of the memory 130 may be difficult as the row or entry decoding is dependent on a $2^x$ value. This value may set one dimension of the memory 130, such as the width. The dimensions of an individual memory cell may set the other dimension, such as the height. In addition, this other dimension may be set by the bit separation or interleaving used to defend against soft errors. In this example, the height may be too tall for efficient placement of the components. The dimensions of the individual memory cell and the bit separation may be parameters that have already been reduced as much as possible while satisfying design requirements.

Figure 2:
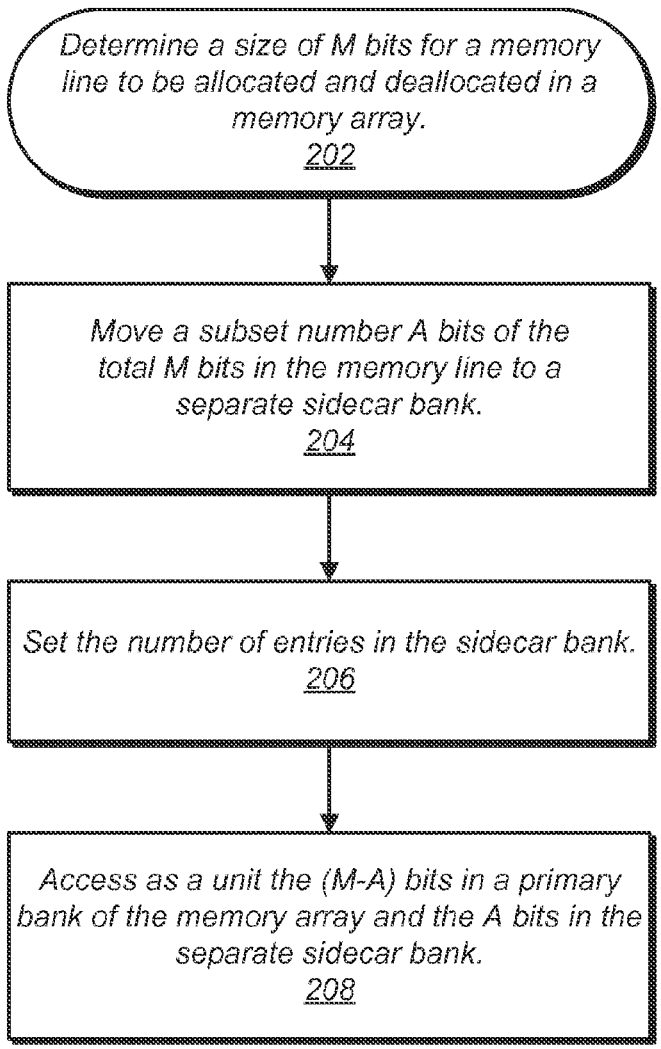
FIG. 2 is a generalized flow diagram of one embodiment of a method for efficiently floor planning a memory.

Referring now to FIG. 2, a generalized flow diagram of one embodiment of a method 200 for efficiently floor planning the memory is illustrated. In some embodiments, the memory is a particular level of a multi-level cache hierarchical memory subsystem. For example, the memory may be the largest sized last-level cache in the computing system. In other embodiments, the memory is a RAM in the computing system. In yet other embodiments, the memory is a set of buffers, such as a set of registers or flip-flops and/or latches. In still yet other embodiments, the memory is a FPGA in the computing system. Other examples of the memory are possible and contemplated.

In block 202, a size of M bits for a memory line in the memory is determined, wherein M is an integer. In various embodiments, a memory line may be the unit of allocation and deallocation in the memory. The size of the memory line may include a number of bits in the memory line. As an example, the size of the memory line may include data, such as a 32-bit or a 64-bit word. In other embodiments, the size of the memory line includes both metadata and data. The metadata may include status and identification information corresponding to the associated data. For example, the memory line may include 10 bits of metadata with a 64-bit data word for a total of 74 bits. Other memory line sizes are possible and contemplated. The size of the memory line may determine the size of an output bus for reading metadata and data as a unit. The size of the memory line may also determine the size of an input bus for writing or updating metadata and data as a unit. The memory line may be varied according to design choice, and may include any size.

In block 204, a subset number A bits of the total M bits in the memory line is moved to a separate sidecar bank, wherein A is an integer. Therefore, the M bits of the memory line are partitioned into (M−A) bits in a primary bank of the memory array and A bits in a separate sidecar bank of the memory array. For example, a memory line with a size of 74 bits may have 14 bits moved to the separate sidecar bank for storage while 60 bits are stored in the primary bank. In block 206, the number of entries in the sidecar bank is set. The primary bank may have N entries or rows, wherein N is an integer. The number of entries in the sidecar bank may be based on the number N entries in the primary bank. Further details are provided shortly.

In block 208, the (M−A) bits in a primary bank of the memory array and the A bits in the separate sidecar bank are accessed as a unit. For example, a read, a write, an update or other memory access request may complete for a particular M-bit memory line by completing access of the (M−A) bits in the primary bank and the A bits in the sidecar bank as a unit. In some embodiments, the access of the primary bank and the sidecar bank as a unit is performed in a same clock cycle. Using the above example with a 74-bit memory line, the 60 bits of the memory line stored in the primary bank and the 14 bits of the memory line stored in the sidecar bank have an access completed as a unit. In various embodiments, the 60 bits in the primary bank and the 14 bits in the sidecar bank have an access completed in a same clock cycle or pipeline stage.

Figure 3:
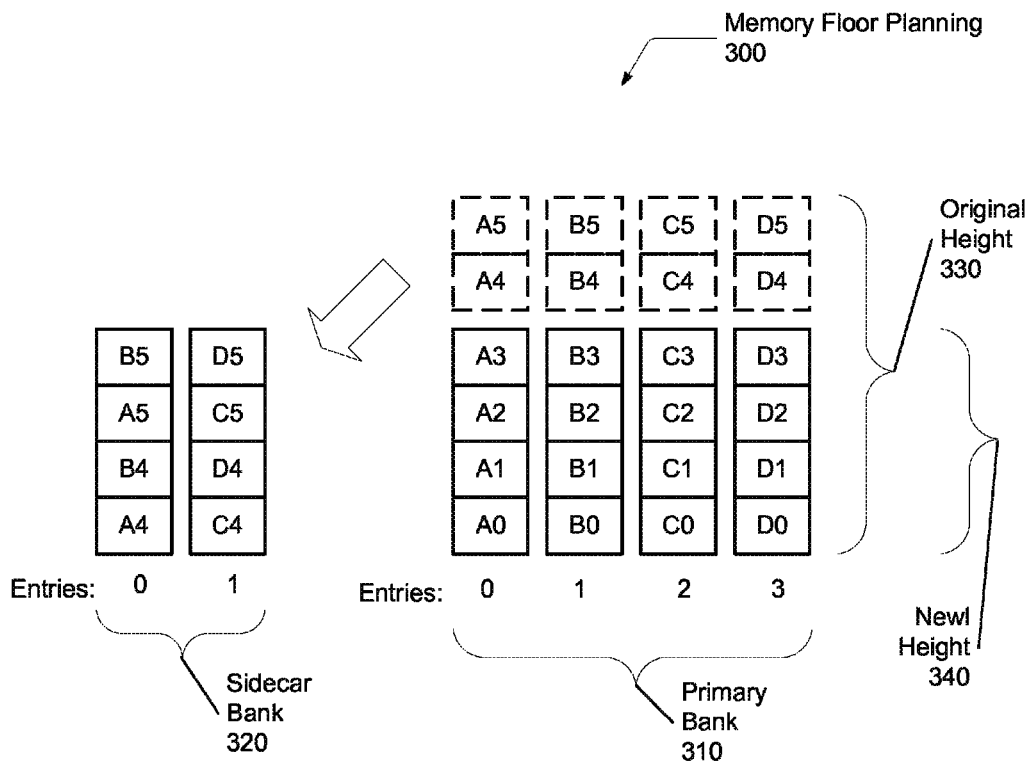
FIG. 3 is a generalized block diagram of one embodiment of efficiently floor planning a memory.

Turning now to FIG. 3, one embodiment of a memory floor planning 300 is shown. Generally speaking, the memory floor planning 300 includes a primary bank 310 and a sidecar bank 320. In this example, the memory line includes a size of 6 bits. Therefore, a memory line includes 6 memory cells. Using the earlier notation, the integer variable M is 6. For example, one particular memory line includes memory cells A0 to A5, such as entry 0 in the primary bank. In this example, 6 is the number of cells accessed as a unit for a memory access request. For example, a memory access request for a particular memory line may access cells A0 to A5. Another memory access request for a different memory line may access cells C0 to C5. In various embodiments, the completion of the memory access request occurs in a same clock cycle or a same pipeline stage for the 6 cells of the particular memory line.

Continuing with the above example, it can be seen that the primary bank 310 actually stores 4 memory cells per entry, such as cells A0 to A3. The memory cells A4 and A5 are shown with a dashed border as these memory cells are moved to the separate sidecar bank 320. Therefore, the integer variable A is 2, and accordingly (M−A) is (6−2), or 4. The primary bank 310 stores 4 of the 6 memory cells of the 6-cell memory line, whereas the sidecar bank 320 stores 2 memory cells of the 6-cell memory line. Entry 1 of the primary bank 310 stores the 4 memory cells B0 to B3, whereas the 2 memory cells B4 and B5 are stored in the sidecar bank 320. Similarly, entry 2 of the primary bank 310 stores the 4 memory cells C0 to C3, whereas the 2 memory cells C4 and C5 are stored in the sidecar bank 320. Entry 3 of the primary bank 310 stores the 4 memory cells D0 to D3, whereas the 2 memory cells D4 and D5 are stored in the sidecar bank 320.

In the example shown, the primary bank 310 has 4 entries or rows. The integer variable N is used to indicate this value, and thus, N is 4. In various embodiments, the sidecar bank may have a number of entries equal to N/D, wherein D is an integer value that is the largest $2^x$ value that is also less than or equal to the value (M−A)/A. In the above example with the 6-bit memory line, the quotient of the number of bits in the primary bank (M−A) and the number of bits in the sidecar bank (A) is (4 bits)/(2 bits), or 2. Therefore, the integer variable D is 2. The number of entries in the sidecar bank is N/D or 4/2 or 2. The sidecar bank 320 has 2 entries or rows.

Memories, such as RAM cells, latches and flip-flops, have storage reliability reduced by soft errors. Neutrons and other particles that collide with a node and cause an appreciable charge or discharge on the node may induce the soft errors. Reduced geometries used in silicon processing of circuitry and reduced supply voltages in semiconductor chips also contribute to soft errors. The upset or affected node may flip its value and loses its stored data.

Error detection and error correction logic and mechanisms are used to prevent data corruption. However, a single event, such as a neutron collision, may upset two or more adjacent memory bit cells across rows or entries of a memory array. Therefore, multiple memory lines may be affected and multiple bit cells within any particular memory line may be affected. The error correction mechanisms may have a limit on a number of upset memory bit cells to be able to correct within a same particular memory line. For example, some error correction coding (ECC) techniques are able to detect up to two bit errors per memory line and correct one bit error per memory line.

In order to further protect data from soft errors, bits in a same memory line are spatially distanced from one another. Rather than increase the size of the memory array with unused space to protect against soft errors, the bits of multiple memory lines are interleaved. The bits in a same memory line are separated by a number of bit cells with the intermediate bit cells belonging to other memory lines. This technique may be referred to as bit separation or bit interleaving. For example, a memory array requiring a 18 micron separation for soft errors with bit cells that have a 2 micron dimension may utilize a 9-bit interleave, or a 9-bit separation. Each bit of a memory line is separated by 8 bits, or 8 bit cells belonging to 8 other memory lines. Each bit, or bit cell, of the memory line has a separation of 18 microns center-to-center.

Returning to the above example, the primary bank 310 has a 1-bit separation with no interleaved bit cells between the bits. For example, the bit cells A0 and A1 do not have any other bit cells between them. The variable S1 is used to indicate the bit separation in the primary bank 310, and in this example, S1 is 1. The variable S2 is used to indicate the bit separation for the sidecar bank 320. The bit separation S2 for the sidecar bank 320 is S1 times D, or 1 times 2, which is 2. The bit cells A4 and A5 have 1 bit cell, which is B4, interleaved between them.

In various embodiments, the height of the sidecar bank 320 is the same as the height of the primary bank 310, which is height 340. In this example, there is no unused space in the sidecar bank 320. However, in other examples, there may be some unused space in the sidecar bank 320 depending on the variables shown in FIG. 3. The selection of the number of bits A to move from the primary bank 310 to the sidecar bank 320 may depend on the resulting amount of unused space in the sidecar bank 320. As shown, the new height 340 used by each of the primary bank 310 and the sidecar bank 320 is less than the original height 330 of the memory array. Although the width of the memory array increased, the height may have decreased by an appreciable amount to aid floor planning of a chip.

Figure 4:
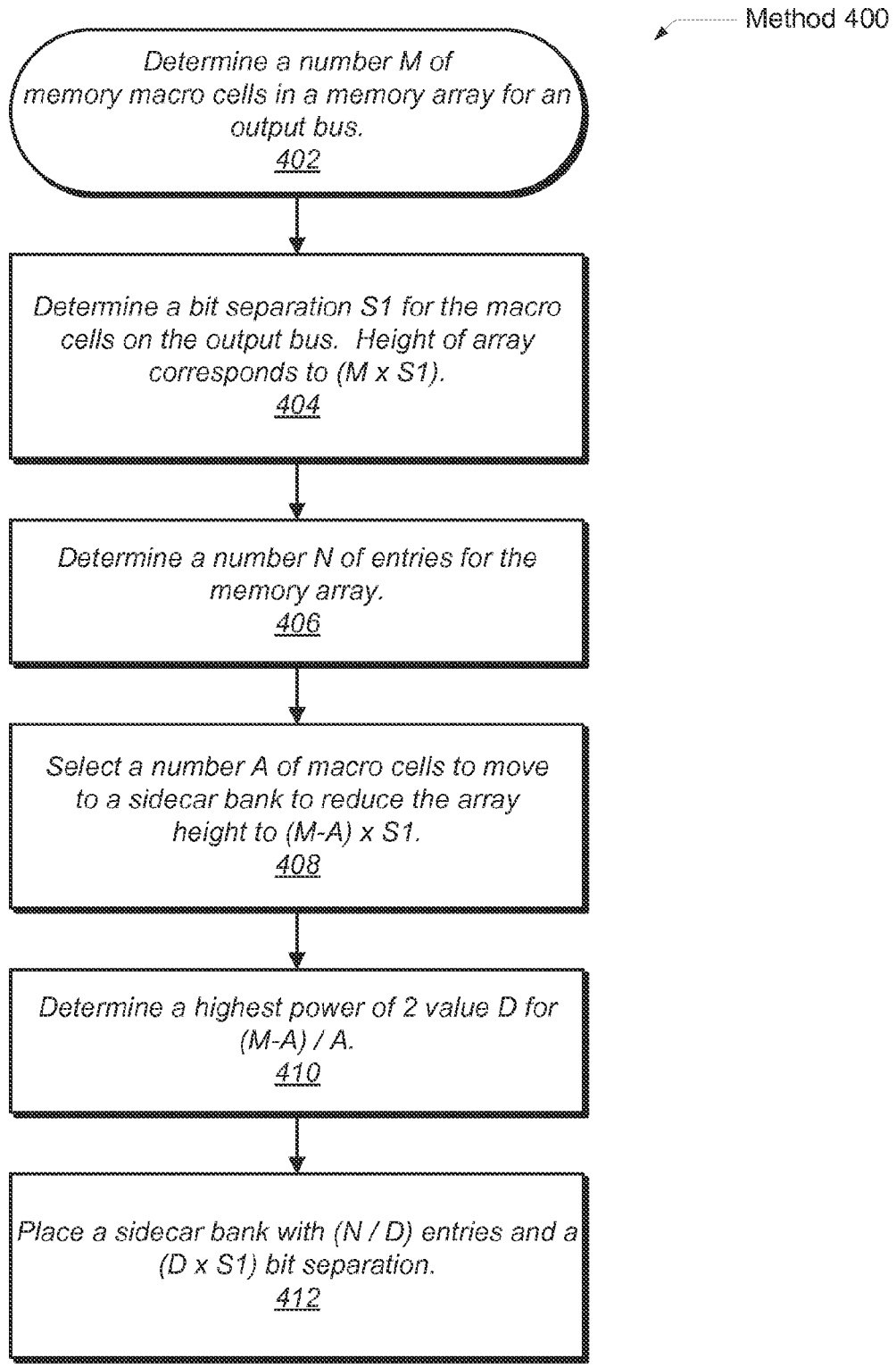
FIG. 4 is a generalized flow diagram of another embodiment of a method for efficiently floor planning a memory.

Referring now to FIG. 4, a generalized flow diagram of another embodiment of a method 400 for efficiently floor planning the memory is illustrated. Similar to the method 200, the components embodied in the computing system described above may generally operate in accordance with method 400. Additionally, program instructions, or generally software, executable by a processor may cause operation in accordance with methods 200 and 400. For purposes of discussion, the steps in the embodiments of methods 200 and 400 are shown in sequential order. However, some steps may occur in a different order than shown, some steps may be performed concurrently, some steps may be combined with other steps, and some steps may be absent in another embodiment.

In block 402, a size of M bits for a memory line in the memory is determined, wherein M is an integer. In various embodiments, the memory line may be the unit of allocation and deallocation in the memory. The size of the memory line may include a number of bits or bit cells in the memory line. Both metadata and a data word size may be used to determine the size of the memory line. In block 404, a bit separation S1 is determined for the memory. The S1 bit separation may be determined by studies for detection and correction of soft errors for the memory. The original height for the memory is a height of a memory bit cell times M times S1. For example, a memory with a 2-micron bit cell height, a 74-bit memory line and an 8-bit separation, the original height is 1,184 microns.

In block 406, the number of entries or rows in the memory is determined. Software simulations of benchmarks and circuit constraints may be used to set the number of entries. For example, the memory may have 128 rows or entries. The memory may be partitioned into 2 banks, such as a left bank and a right bank. Each bank may have 64 entries or rows. Therefore, the integer variable N is 64. In block 408, a number of A bit cells to remove from the memory line in the memory array is selected. The new height of the memory array may be the height of the memory bit cell times (M−A) times S1. Using the above example, selecting 14 bits to move to a sidecar bank causes the new height of the memory array to be 2 microns per bit times (74-14) bits times 8-bit separation, or 960 microns. The height of the memory array may be reduced from 1,184 microns to 960 microns.

In block 410, the largest $2^x$ value that is also less than or equal to the quotient (M−A)/A is determined. Using the above example, this value indicated by the integer D is (74−14)/14, which is 60/14 or 4.29. The largest $2^x$ value and is still less than or equal to 4.29 is 4. Therefore, in this example, the integer D is 4. In block 412, a sidecar bank storing A bits of the M-bit memory line is placed. The sidecar bank includes (N/D) entries and a (D×S1) bit separation. Using the above 74-bit memory line example, the sidecar bank stores 14 bits of the 74-bit memory line and includes (64/4), or 16, entries or rows. The sidecar bank uses (4×8), or 32, bit separation. The primary bank maintains including 64 entries and 8-bit separation while storing only 60 bits of the 74-bit memory line.

Figure 5:
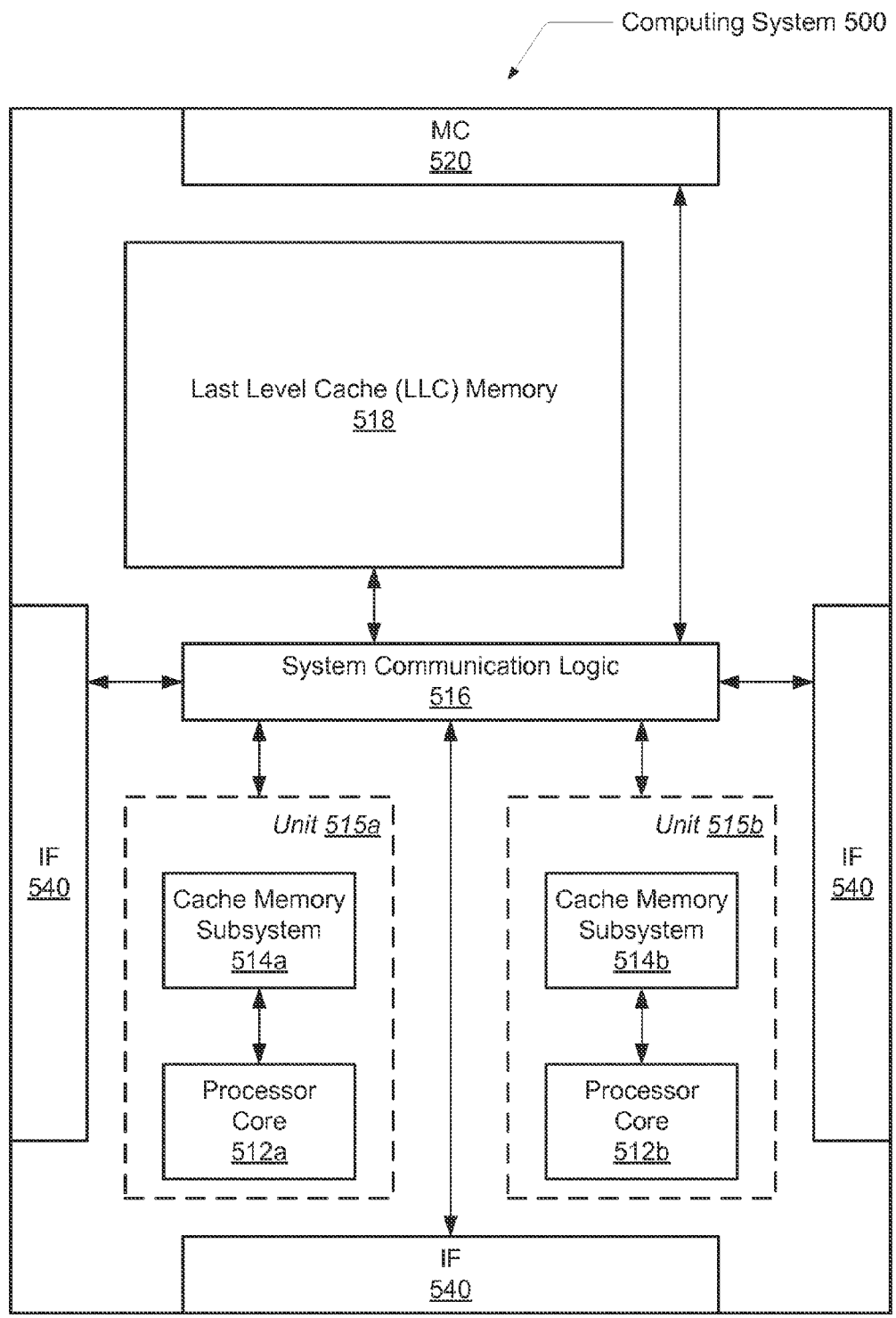
FIG. 5 is a generalized block diagram of another embodiment of a computing system.

Referring to FIG. 5, another embodiment of a computing system 500 is shown. Generally speaking, the computing system 500 may include memory controller 520, interface logic 540, one or more processing units 515a-515b, which may include processor cores 512a-512b and corresponding cache memory subsystems 514a-514b; system communication logic 516, and a shared cache memory subsystem 518.

The shared cache 518 may be a last-level cache. In one embodiment, the illustrated functionality of the computing system 510 is incorporated upon a single integrated circuit. In another embodiment, the illustrated functionality is incorporated in a chipset on a computer motherboard.

In one embodiment, the computing system 510 is a stand-alone system within a mobile computer, a desktop, a server, or other. In other embodiments, the computing system 510 is one node within a socket of a multi-socket system. In some embodiments, the processing units 515a-515b and one or more other sources outside of the computing system 510 may access the shared cache memory subsystem 518. The other sources may include general-purpose processors and graphical processing units (GPU's) on other nodes, input/output (I/O) devices, and so forth.

In other embodiments, another level of cache, such as caches 514a-514b, in the cache memory hierarchy may be shared by multiple sources. Regardless of the level within the memory hierarchy, a particular level, such as the last-level, of the cache hierarchical memory subsystem may have a dimension, such as the height, that is sufficiently great as to interfere with the placement of other components. The other components may not fit within the same die or the same package. Alternatively, the other components may fit but the placement of the components creates an appreciable amount of unused space on the same die or the same package. The placement of the components is either inefficient or renders the chip inoperable. This particular level of the cache memory subsystem may be re-floor planned as described earlier. Before providing further details, a further description of the components in the computing system 500 is given.

Although two processor cores are shown in FIG. 5, the computing system 500 may include another number of processor cores, such as a single processor core, four processor cores, and so forth. In various embodiments, processor cores 512a-512b include circuitry for executing instructions according to a predefined instruction set. The x86® instruction set architecture (ISA) may be selected. Alternatively, the x86-64®, Alpha®, PowerPC®, MIPS®, SPARC®, PA-RISC®, or any other instruction set architecture may be selected. In other embodiments, the processor cores 512a-512b may include other processors such as a graphics processing unit (GPU), another type of single-instruction-multiple-data (SIMD) core, a digital signal processor (DSP), a field programmable gate array (FPGA), and other computing circuitry.

Generally, processor cores 512a-512b access the cache memory subsystems 514a-514b, respectively, for data and instructions. As used herein, the term "access" regarding a cache memory subsystem refers to performing a read, a write, or an update request operation that may result in a cache hit if the requested data of a corresponding request address resides in the cache or a cache miss if it does not reside in the cache. The data has corresponding metadata stored in the cache. The metadata may include a cache entry valid state, dirty and clean cache line states, home or local node and remote node states, cache coherence states, process or processor owner identifiers (ID's), thread ID's, system-level transaction ID's, shared and private states, instruction type and data type, and so forth. In various embodiments, the size of a cache line to be accessed includes one or more of these fields in addition to the data.

If a cache miss occurs, such as a requested block is not found in a respective one of the cache memory subsystems 514a-514b or in shared cache memory subsystem 518, then a read request may be generated and transmitted to the memory controller 520 to which the missing block is mapped. A corresponding cache fill line with the requested block may be conveyed to the corresponding cache in order to complete the original request. In addition, the cache fill line may be placed within a corresponding set within the cache. If there are no available ways within the corresponding set, then typically a Least Recently Used (LRU) algorithm determines which way within the set is to have its data evicted and replaced by the cache fill line data. As used herein, the term "allocate" refers to storing a cache fill line fetched from a lower level of the cache hierarchy into a way of a particular cache subsequent a cache miss to the particular cache.

Cache subsystems 514a-514b and 518 may comprise high-speed cache memories or arrays configured to store blocks of data. Variations of the six-transistor RAM bit cell may be used. A corresponding cache controller may be coupled to the cache arrays. Cache memory subsystems 514a-514b may be implemented as a hierarchy of caches. In some embodiments, cache memory subsystems 514a-514b each represent L2 cache structures, and shared cache subsystem 518 represents an L3 cache structure. An L1 cache structure may be integrated within each of the processor cores 512a-512b. Other combinations and hierarchies are possible and contemplated.

Memory controller 520 may be used to connect the processor 500 to off-die memory. Memory controller 520 may follow memory channel protocols for determining values used for information transfer, such as a number of data transfers per clock cycle, signal voltage levels, signal timings, signal and clock phases and clock frequencies. The off-die memory may include one of multiple types of dynamic random access memories (DRAMs) or other memory technologies.

The interface 540 may include integrated channel circuitry to directly link signals to other processing units or nodes. The interface 540 may utilize one or more coherence links for inter-node access of processor on-die caches and off-die memory of another processing node. Examples of the technology include HyperTransport and QuickPath. I/O devices may include many variations of computer peripheral devices. In some embodiments, system communication logic 516 is a system bus. In another embodiment, processing node 510 incorporates a Northbridge system bus controller in logic 516 in order to couple processing units 515a-515b to an off-chip memory, input/output (I/O) devices, other off-chip processors.

Figure 6:
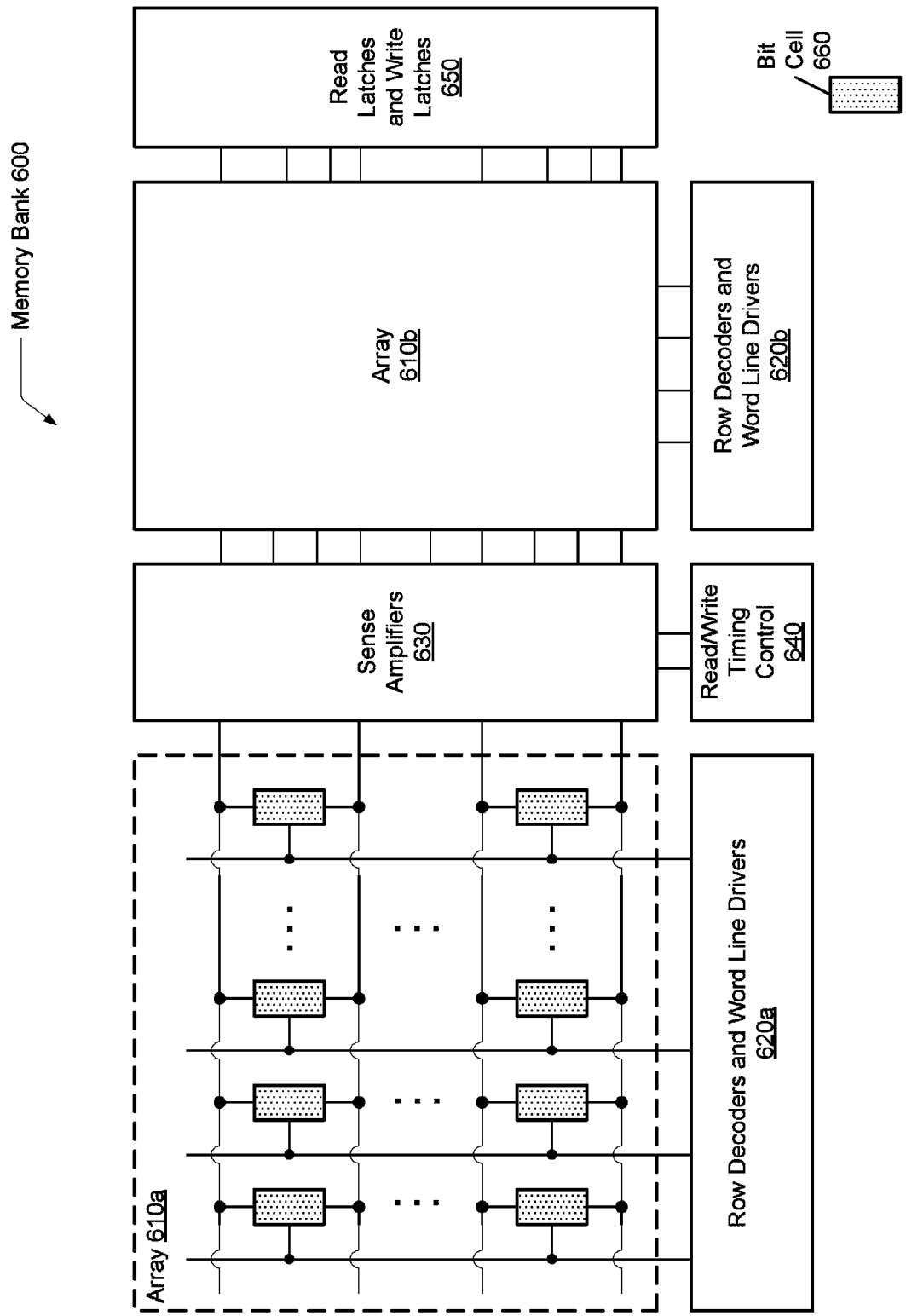
FIG. 6 is a generalized block diagram of one embodiment of a memory bank.

Turning now to FIG. 6, a generalized block diagram of one embodiment of a memory bank 600 is shown. In various embodiments, the bank 600 is a left bank or a right bank of a partitioned memory. As shown, the bank 600 includes arrays 610a-610b, row decoders 620a-620b, sense amplifiers in block 630 between the arrays 610a-610b, read and write timing control logic 640 and read latches and write latches in block 650. Each of the blocks 610a-610b, 620a-620b, and 630-650 in the memory bank 600 may be communicatively coupled to another one of the blocks. For example, direct connections may be used wherein routing may occur through another block. Alternatively, staging of signals may be done in an intermediate block. In various embodiments, each of the arrays 610a-610b includes multiple memory bit cells 660 arranged in a tiled format. Each one of the memory bit cells may be a copied variation of a six-transistor RAM cell selected based on design needs.

The row decoders and word line drivers in blocks 620a-620b receive address information corresponding to an access request. Each one of the blocks 620a-620b selects a particular row, or entry, of the multiple rows in an associated one of the arrays 620a-620b. For write access requests, the write latches are located in block 650. The write data is driven into the arrays 610a-610b. The timing control logic 640 sets up the write word line driver logic and updates the write latches with new data in block 650. The write data is written into a row of bit cells that is selected by an associated one of the blocks 620a-620b. In some embodiments, precharge circuitry is included in block 650.

For read access requests, the block 650 may be used to precharge the read lines routed to the arrays 610a-610b. The timing logic in block 640 may be used for precharging and setting up the sense amplifiers in the block 630. The timing control logic 640 sets up the read word line driver logic and a selected row selected by an associated one of the row decoders 620a-620b provides its data on the read lines, which are sensed by the sense amplifiers. The read latches capture the read data. For each of the write access requests and read access requests, the selected row may have certain bit cells selected for completion of the access request. Bit separation also referred to as bit interleaving may be used to protect against soft errors. The height of the bank 600 may be sufficiently great as to interfere with the placement of other components on a die or a package. Therefore, the bank 600 may utilize a sidecar bank as described earlier. Another illustration of the use of a sidecar bank is provided shortly.

Figure 7:
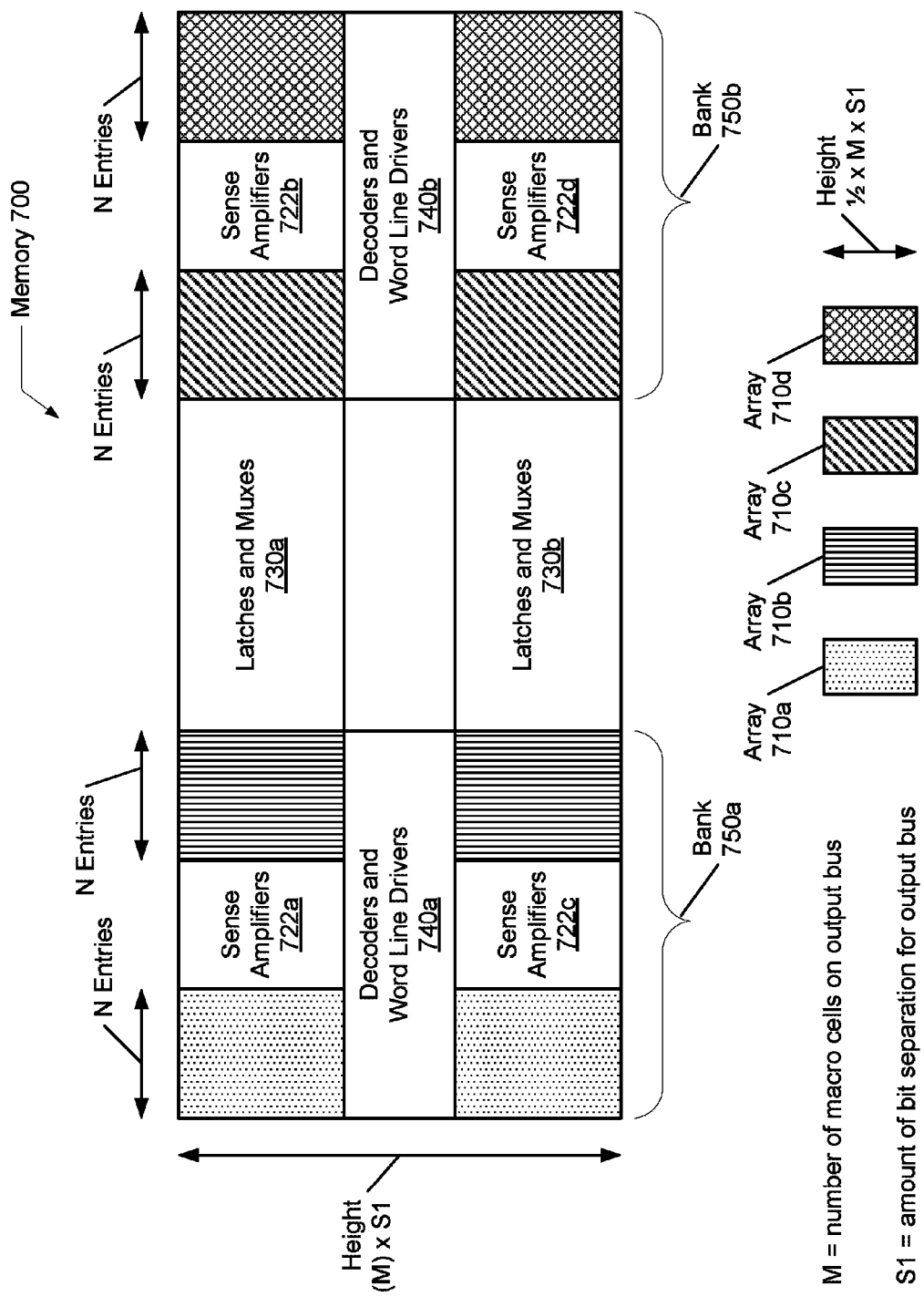
FIG. 7 is a generalized block diagram of another embodiment of a floor-planned memory.

Turning now to FIG. 7, a generalized block diagram of another embodiment of a floor-planned memory 700 is shown. In various embodiments, the memory 700 may be used as a last-level cache on a die or on a package. The banks 750a-750b may utilize a layout as previously described for the bank 600 in FIG. 6. Row decoders and row word line drivers for the memory 700 may be in blocks 740a-740b. Further, as shown, the memory 700 includes sense amplifiers in blocks 722a-722d. Additionally, the memory 700 includes read and write latches in blocks 730a-730b.

The memory 700 is partitioned into the banks 750a-750b. Additionally, the banks 750a-750b are partitioned. For example, the bank 750a includes array 710a, which is partitioned into a top half and a bottom half. The array 710a may be partitioned to reduce the length of word lines. As the length of word lines increase, signal noise effects increase. Additionally, the amount of capacitative load on the word line increases as the number of connected bit cells increase, which causes the word line drivers to increase in size. As an example, half of a memory line may be stored in an entry in the top half of the array 710a. The corresponding other half of the memory line may be stored in the same entry in the bottom half of the array 710a. Similarly, the bank 750a includes array 710b, which is also partitioned into a top half and a bottom half. In a similar manner, the bank 750b includes the arrays 710c-710d. Each of the arrays 710a-710d may include a same number N of entries or rows. For example, each of the arrays 710a-701d may include 64 entries or rows.

The total height of the memory 700 is the height of a memory bit cell times the M number of bits in the memory line times the S1 bit separation used to guard against soft errors. The height of the blocks 740a-740b also contributes to the total height, but may contribute a significantly less fraction of the total height than the arrays. In order to reduce the height of the memory 700, a number of bits in the memory line may be moved to a sidecar bank. An example of this repartitioning of the memory 700 is described next.

Figure 8:
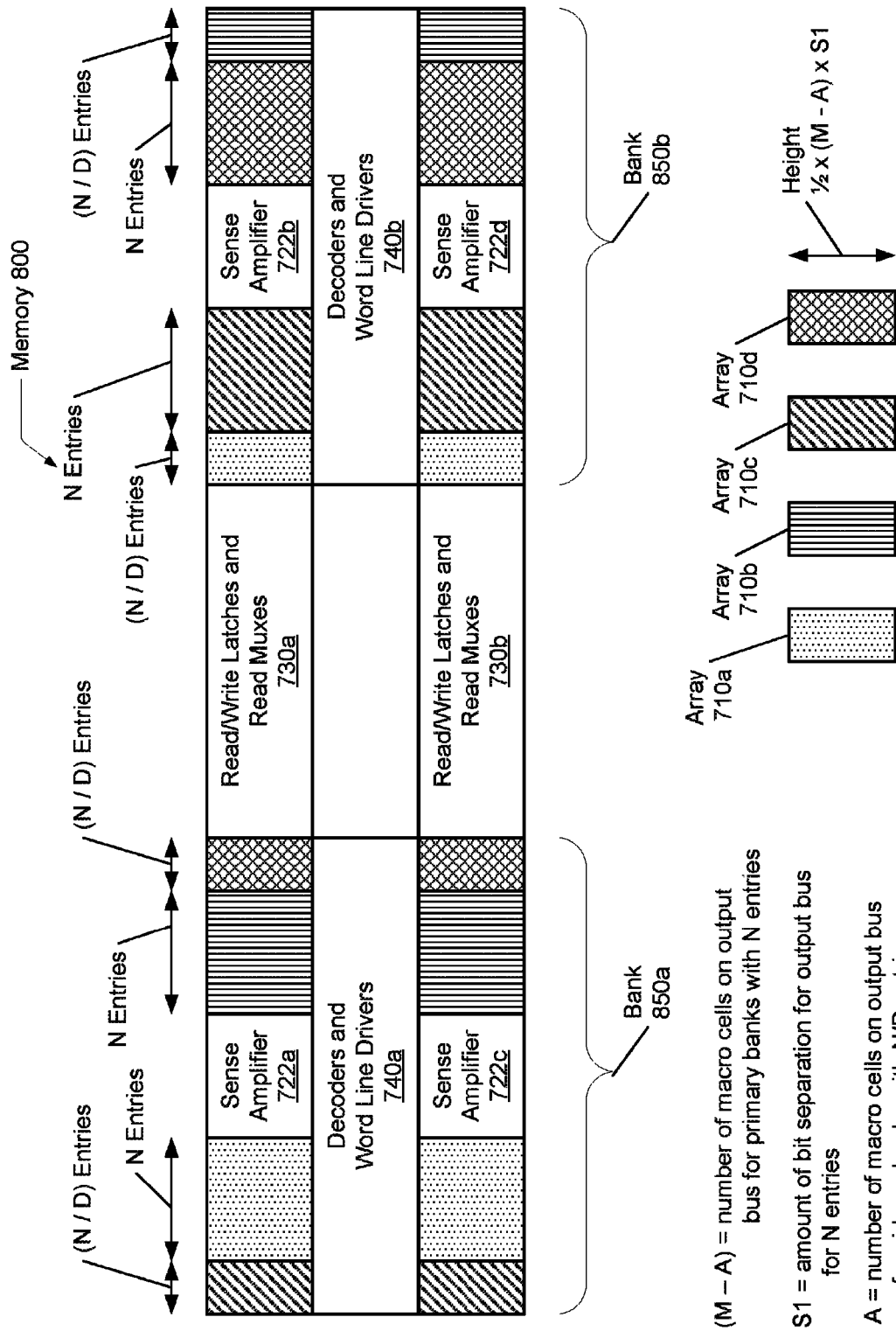
FIG. 8 is a generalized block diagram of another embodiment of an efficiently floor planned memory.

Turning now to FIG. 8, a generalized block diagram of another embodiment of an efficiently floor planned memory 800 is shown. Circuitry and control logic similar to those used in the memory 700 are numbered identically. Each of the banks 850a-850b includes respective ones of the arrays 710a-710d as described earlier, but also include sidecar banks Each of the banks 850a-850b includes primary banks with N entries and sidecar banks with (N/D) entries. The sidecar banks are located in the opposite one of the banks 850a-850b that includes the associated primary bank. For example, the array 710a has a primary bank with N entries located in the bank 850a, wherein the primary bank is divided into a top half and a bottom half. The array 710a also has a sidecar bank with (N/D) entries located in the bank 850b, wherein the sidecar bank is divided into a top half and a bottom half. In a similar manner, the arrays 710b-710d have a primary bank and a sidecar bank in opposite ones of the banks 850a-850b.

Using the earlier example with a 74-bit memory line and 14 bits are moved to sidecar banks, the bank 850a includes 2 primary banks, one for each of the arrays 710a and 710b. Each of these primary banks includes 64 entries. Each of these primary banks includes (M−A), or (74−14), or 60 bits of the 74-bit memory line. The top halves of the primary banks include 30 bits. Similarly, the bottom halves of the primary banks include 30 bits.

In addition, the bank 850a includes 2 sidecar banks, one for each of the arrays 710c and 710d. Each of the sidecar banks include (N/D), or (64/4), or 16 entries. Each of the sidecar banks includes 14 bits in this example. The entries in the top halves of the sidecar banks include 7 bits of a respective memory line. Similarly, the entries in the bottom halves of the sidecar banks include 7 bits of a respective memory line. The shared sense amplifier 722a reads from a bit line shared by each primary bank and unassociated sidecar bank in the top half of the bank 850a. Similarly, the shared sense amplifier 722c charges a bit line shared by each primary bank and unassociated sidecar bank in the bottom half of the bank 850a.

Continuing with the above example, each of the primary banks in the memory 800 has an 8-bit separation. Each of the sidecar banks has a bit separation of (S1×D), or (8×4), or 32. In a similar manner, the bank 850b has primary banks for arrays 710c and 710d and sidecar banks for arrays 710a and 710b. When a request is received to access a 74-bit memory line corresponding to the array 710a, 60 bits of the memory line are accessed in the corresponding primary bank in the bank 850a. Additionally, 14 bits of the memory line are accessed in the corresponding sidecar bank in the bank 850b. Since bit lines are read by a shared sense amplifier and the bit lines are shared by the primary banks and the unassociated sidecar banks, the read muxes in the blocks 730a-730b select between information stored in primary banks and information stored in the sidecar banks. The read muxes in a respective one of the blocks 730a-730b select between the one of the A bits in a sidecar bank and a set of D bits of the (M−A) bits in an unassociated primary bank. For example, when D is 4, a read mux may select between bits 59 to 56 in the primary bank and bit 73 in the sidecar bank. Here, the read mux selected between the most-significant 4 bits of the 60 bits in the primary bank and the most-significant single bit in the sidecar bank.

Figure 9:
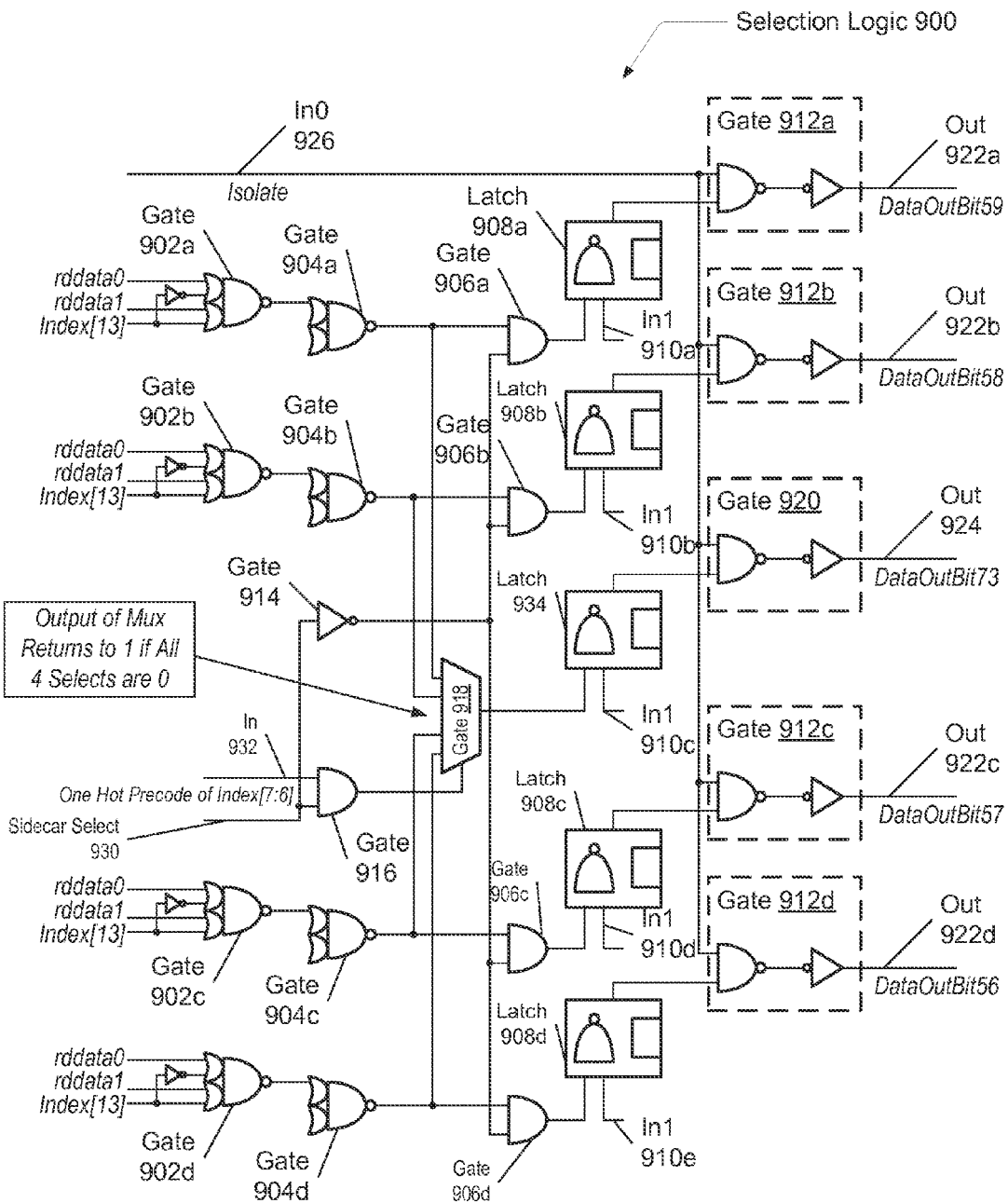
FIG. 9 is a generalized block diagram of one embodiment of selection logic.

Referring now to FIG. 9, a generalized block diagram of one embodiment of selection logic 900 is shown. The selection logic 900 may be used to select between one of the A bits in a sidecar bank and a set of D bits of the (M−A) bits in an unassociated primary bank. For example, when the integer variable D is 4 and the requested memory line includes 74 bits, the selection logic 900 may select for the most significant portion of the memory line between bits 59 to 56 in the primary bank and bit 73 in the sidecar bank. The selection logic 900 may be repeated for the remaining bits of the memory line. For example, an instantiated copy of the selection logic 900 may be used to select between bits 55 to 52 in the primary bank and bit 72 in the sidecar bank, and so forth.

As shown, the selection logic 900 may include gates 902a-902d, 904a-904d, 914 and 916 for receiving address information in a memory access request corresponding to a particular memory line and data corresponding to the particular memory line. In the example shown, the index bits 6, 7 and 13 are used for illustrative purposes for identifying a portion of the particular memory line. The gate 916 also receives the decode signal Sidecar Select 930. The signal 930 determines whether the received data is from a sidecar bank or a primary bank. For example, returning to FIG. 8, the block 730a may receive data on the left from either one of the two sidecar banks in bank 850a or one of the two primary banks in bank 850a. Similarly, the block 730a may receive data on the right from either one of the two sidecar banks in bank 850b or one of the two primary banks in bank 850b. If data from the left is coming from a sidecar bank, then data from the right is coming from a primary bank, and vice-versa. If the received data is from a sidecar bank, the received data is muxed by a further four-to-one mux, such as gate 918.

Gates 906a-906d and latches 908a-908d and 934 receive the muxed input data, shown as In1 910a-910e, and provide the data to the gates 912a-912d and 920 to drive the output signals 922-922d and 924. Using the selection logic 900 in combination with moving bits of the memory lines from the primary banks to the sidecar banks allows for adjusting the aspect ratio of the memory floor plan. Adjusting the floor plan aspect ratio may improve power consumption, performance and on-die area utilization.

It is noted that the above-described embodiments may comprise software. In such an embodiment, the program instructions that implement the methods and/or mechanisms may be conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Additionally, program instructions may comprise behavioral-level description or register-transfer level (RTL) descriptions of the hardware functionality in a high level programming language such as C, or a design language (HDL) such as Verilog, VHDL, or database format such as GDS II stream format (GDSII). In some cases the description may be read by a synthesis tool, which may synthesize the description to produce a netlist comprising a list of gates from a synthesis library. The netlist comprises a set of gates, which also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. Alternatively, the instructions on the computer accessible storage medium may be the netlist (with or without the synthesis library) or the data set, as desired. Additionally, the instructions may be utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system comprising:
   a processing unit;
   a memory comprising at least a primary bank and a sidecar bank, wherein a size of each memory line in the memory comprises M bits, wherein the primary bank comprises a first portion of each memory line and the sidecar bank comprises a second portion of each memory line, wherein the sidecar bank comprises A bits of the M bits and the primary bank comprises (M−A) bits of the M bits, wherein (M−A) is greater than A; and
   control logic;
   in response to receiving an access request from the processing unit, the access request corresponding to a first memory line:
      access both a first entry of a first plurality of entries in the primary bank and a second entry of a second plurality of entries in the sidecar bank based on a same address in the received access request; and
      complete the access request in a predetermined portion of the first entry of the primary bank and in a predetermined portion of the second entry of the sidecar bank.

2. The computing system as recited in claim 1, wherein in further response to receiving the access request, the control logic is further configured to access at least a first bit line in the primary bank and a second bit line in the sidecar bank for the access request, wherein the first bit line has a same number of bit lines above it as a number of bit lines above the second bit line and the first bit line has a same number of bit lines below it as a number of bit lines below the second bit line.

3. The computing system as recited in claim 1, wherein the sidecar bank has a number of entries equal to the number of entries in the primary bank divided by the integer D, wherein D is a largest $2^x$ value that is less than or equal to a ratio of (M−A)/A.

4. The computing system as recited in claim 1, wherein the primary bank has a bit separation S1 and the sidecar bank has a bit separation S2 equal to D times S1, wherein D is a largest $2^x$ value that is less than or equal to the ratio of (M−A)/A.

5. The computing system as recited in claim 1, wherein the memory further comprises a left bank and a right bank separated from one another, wherein at least one of the left bank and the right bank includes both a primary bank and an associated sidecar bank.

6. The computing system as recited in claim 1, wherein the memory further comprises a left bank and a right bank separated from one another, wherein the left bank includes a primary bank and the right bank includes an associated sidecar bank.

7. The computing system as recited in claim 6, wherein in response to a request to access the given memory line stored in the memory, the control logic is configured to:
   access the entry of the left bank;
   access the entry of the right bank;
   select the first portion from the primary bank of the entry of the left bank; and
   select the second portion from the sidecar bank of the entry of the right bank.

8. The computing system as recited in claim 1, further comprising a left bank comprising a plurality of entries and a right bank comprising a plurality of entries, wherein:
   each entry in the left bank and each entry in the right bank is partitioned into a given primary bank and a sidecar bank unassociated with the given primary bank; and
   in response to receiving a given memory line comprising M bits for storage in the memory, the control logic is configured to:
      partition the given memory line into a first portion and a second portion;
      store the first portion in a primary bank of an entry of the left bank; and
      store the second portion in a sidecar bank of an entry of the right bank.

9. A method executable by at least one processor in a computing system, the method comprising:
   in response to receiving an access request corresponding to a first memory line in a memory comprising at least a primary bank and a sidecar bank, wherein a size of each memory line in the memory comprises M bits, wherein the primary bank comprises a first portion of each memory line and the sidecar bank comprises a second portion of each memory line, wherein the sidecar bank comprises A bits of the M bits and the primary bank comprises (M−A) bits of the M bits, wherein (M−A) is greater than A:
      accessing both a first entry in the primary bank and a second entry in the sidecar bank based on a same address in the received access request; and
      completing the access request in a predetermined portion of the first entry of the primary bank and in a predetermined portion of the second entry of the sidecar bank.

10. The method as recited in claim 9, wherein in further response to receiving the access request, the method further comprises accessing at least a first bit line in the primary bank and a second bit line in the sidecar bank for the access request, wherein the first bit line has a same number of bit lines above it as a number of bit lines above the second bit line and the first bit line has a same number of bit lines below it as a number of bit lines below the second bit line.

11. The method as recited in claim 9, wherein the sidecar bank has a number of entries equal to the number of entries in the primary bank divided by the integer D, wherein D is a largest $2^x$ value that is less than or equal to the ratio of (M−A)/A.

12. The method as recited in claim 9, wherein the primary bank has a bit separation S1 and the sidecar bank has a bit separation S2 equal to D times S1 wherein D is a largest $2^x$ value that is less than or equal to the ratio of (M−A)/A.

13. The method as recited in claim 9, wherein the memory further comprises a left bank and a right bank separated from one another, wherein the left bank includes a primary bank and the right bank includes an associated sidecar bank.

14. The method as recited in claim 13, wherein for at least one of the left bank and the right bank, for each one of the A bits in a sidecar bank, the method further comprises selecting for the received access request between one of the A bits in a sidecar bank and a set of D bits of the (M−A) bits in an unassociated primary bank, wherein D is a largest $2^x$ value that is less than or equal to the ratio of (M−A)/A.

15. A non-transitory computer readable storage medium storing program instructions, wherein the program instructions are executable to:
  in response to receiving an access request corresponding to a first memory line in a memory comprising at least a primary bank and a sidecar bank, wherein a size of each memory line in the memory comprises M bits, wherein the primary bank comprises a first portion of each memory line and the sidecar bank comprises a second portion of each memory line, wherein the sidecar bank comprises A bits of the M bits and the primary bank comprises (M−A) bits of the M bits, wherein (M−A) is greater than A:
    access both a first entry in the primary bank and a second entry in the sidecar bank based on a same address in the received access request; and
    complete the access request in a predetermined portion of the first entry of the primary bank and in a predetermined portion of the second entry of the sidecar bank.

16. The non-transitory computer readable storage medium as recited in claim 15, wherein in further response to receiving the access request, the program instructions are further executable to access at least a first bit line in the primary bank and a second bit line in the sidecar bank for the access request, wherein the first bit line has a same number of bit lines above it as a number of bit lines above the second bit line and the first bit line has a same number of bit lines below it as a number of bit lines below the second bit line.

17. The non-transitory computer readable storage medium as recited in claim 15, wherein the sidecar bank has a number of entries equal to the number of entries in the primary bank divided by the integer D, wherein D is a largest $2^x$ value that is less than or equal to the ratio of (M−A)/A.

* * * * *